United States Patent [19]

Un

[11] 4,352,191
[45] Sep. 28, 1982

[54] HYBRID COMPANDING DELTA MODULATION SYSTEM

[76] Inventor: Chong K. Un, Apt. E-1 San 4-51 Hoeki-dong, Dongdaemun-ku, Seoul, Rep. of Korea

[21] Appl. No.: 151,330

[22] Filed: May 19, 1980

[51] Int. Cl.³ .......................................... H03K 13/22
[52] U.S. Cl. .................................. 375/30; 332/11 D; 375/26
[58] Field of Search ...................... 375/30, 31, 32, 26; 332/11 D

[56] References Cited

U.S. PATENT DOCUMENTS

| | | | |
|---|---|---|---|
| 3,569,834 | 3/1971 | Debart | 375/31 |
| 3,727,135 | 4/1973 | Holzer | 332/11 D |
| 3,757,252 | 9/1973 | Deschenes et al. | 375/32 |
| 3,973,081 | 8/1976 | Hutchins | 179/15.55 R |
| 4,042,921 | 8/1977 | Smith | 332/11 D |
| 4,215,311 | 7/1980 | Kittel et al. | 375/30 |

Primary Examiner—Glen R. Swann, III
Attorney, Agent, or Firm—John J. Posta, Jr.

[57] ABSTRACT

A hybrid companding delta modulation system is an improvement of adaptive delta modulation and is particularly suitable for coding a speech signal. It employs both syllabic and instantaneous companding schemes. The syllabic compandor provides a long term step size of the quantizer which varies relatively slowly by estimating either the envelope of slope or amplitude variation of the input signal. On the other hand, the instantaneous compandor adjusts the step size instantaneously according to a predetermined control logic in response to variations of the input signal. With the hybrid companding delta modulation system the dynamic range of the system can be made as large as the range of the input signal level. The signal-to-quantization noise ratio is improved over presently known adaptive delta modulation systems. Finally, the effect of channel errors is minimized.

17 Claims, 3 Drawing Figures

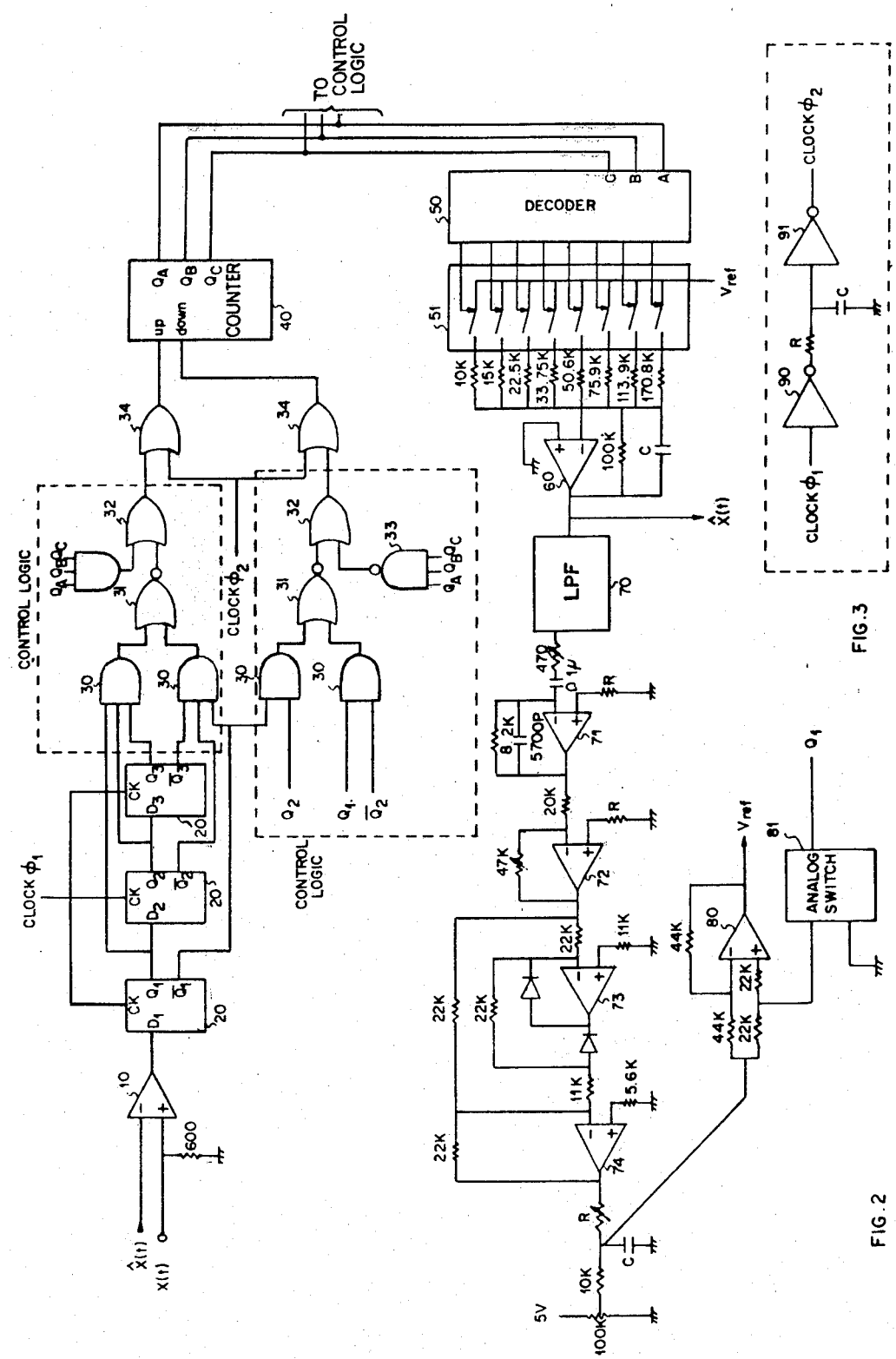

HYBRID COMPANDING DELTA MODULATION SYSTEM

BACKGROUND OF THE INVENTION

The present invention relates generally to improvements in coding speech by hybrid companding (compressing and expanding) delta modulation and particularly relates to economical methods of implementing the codec or system with standard integrated circuits.

Adaptive delta modulation is a predictive coding system. It is basically the same as the adaptive differential pulse code modulation with a one-bit quantizer. Adaptive delta modulation systems presently known employ either syllabic or instantaneous companding schemes which are used separately. The purpose is to adapt the quantizer step size in response to variations of the input signal level. In a syllabically companding adaptive delta modulation system the one-bit quantizer step size is changed relatively slowly at a syllabic rate according to the variation of the input signal. On the other hand, in an instantaneously companding adaptive delta modulation system the quantizer step size is adapted to the input signal level instantaneously at every sampling time.

It is known that adaptive delta modulation yields significantly improved performance in signal-to-noise ratio and dynamic range over linear delta modulation. However, either one of the present adaptive delta modulation companding systems has shortcomings because a large amount of slope overload noise may occur whenever the input signal changes abruptly. Further, an instantaneous companding adaptive delta modulation such as constant factor delta modulation suffers a large degradation of the signal-to-noise ratio when bit errors occur. Also, continuously variable slope delta modulation which may be regarded as a representative method of the syllabically companding adaptive delta modulation has a relatively narrow dynamic range.

In this connection, reference is made to a paper by the Applicant and Hwang Soo Lee entitled "A Comparative Performance Study of Adaptive Delta Modulation Systems" which appears in Record of IEEE 1979, International Conference on Communications June, 1979, (Also appears in IEEE Transactions Comm. January, 1980).

This paper discusses adaptive delta modulation with syllabic companding where a one-bit quantizer samples the error signal in accordance with a desired clock or transmission rate. The quantizer step size is controlled by the syllabic compandor which includes a 3 or 4 bit shift register, a comparator and a low pass filter.

This syllabically companding system was compared with an instantaneous companding system. Here the quantizer step size is varied discretely at every sampling time. By means of computer simulation the paper compares the merits of these and other adaptive delta modulation systems.

Reference is also made to the patent to Hutchins U.S. Pat. No. 3,973,081, which relates to feedback residue compression for digital speech systems. While this patent has no direct bearing on the present invention, it is referred to for general background information.

It is accordingly an object of the present invention to overcome at least some of the shortcomings of the prior art as discussed hereinabove.

A further object of the present invention is to provide a hybrid companding delta modulation system for improving the performance of adaptive delta modulation systems.

SUMMARY OF THE INVENTION

In accordance with the present invention a hybrid companding delta modulation system is provided. While the system of the invention is particularly adapted for coding speech, it will be understood that it may be used for other signals such as video signals and data signals.

The system of the present invention employs simultaneously syllabic and instantaneous companding schemes. For syllabic companding the slope of the input signal may be estimated by differentiating, rectifying and then low pass filtering the decoded speech. This slope energy information may be used as a relatively slowly varying basic step size of the adaptive delta modulation quantizer. However, it will be understood that the slope information may be obtained directly from the input signal instead of from the decoded signal. In this case, however, a buffer would be required to store the input signal. Further, the slope information will have to be transmitted after multiplexing it with the adaptive delta modulation output signal. It is also feasible in either case discussed hereinabove to utilize the amplitude of the input signal instead of its slope for syllabic companding. In this case, differentiation is not required.

Besides companding it in a syllabic rate based on the estimated slope energy or amplitude the quantizer step size is companded instantaneously in accordance with the present invention at every sampling instant according to a predetermined control logic. In order to carry out the instantaneous companding the present bit and two previous bits $b_n$, $b_{n-1}$ and $b_{n-2}$ are stored in series connected flip-flops forming a shift register. The control logic compares the signs of $b_n$, $b_{n-1}$ and $b_{b-2}$. The resulting logic state of an up/down counter then leads to the selection of one of several, for example 8, values of a multiplier for changing the step size of the quantizer. It will be understood that various types of control logic may be used.

The dynamic range of the system of the invention may be made as large as the range of the input signal level. The signal-to-quantization noise ratio may be improved over presently known adaptive delta modulation systems. Finally, the effect of channel errors may be minimized.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

BRIEF DESCRIPTION OF THE DRAWINGS

FIG. 2 is a detailed circuit diagram of the invention corresponding to the block representation of FIG. 1; and FIG. 3 is a circuit diagram for generating two clock signals, one being delayed with respect to the other.

DESCRIPTION OF THE PREFERRED EMBODIMENT

Figure 1:
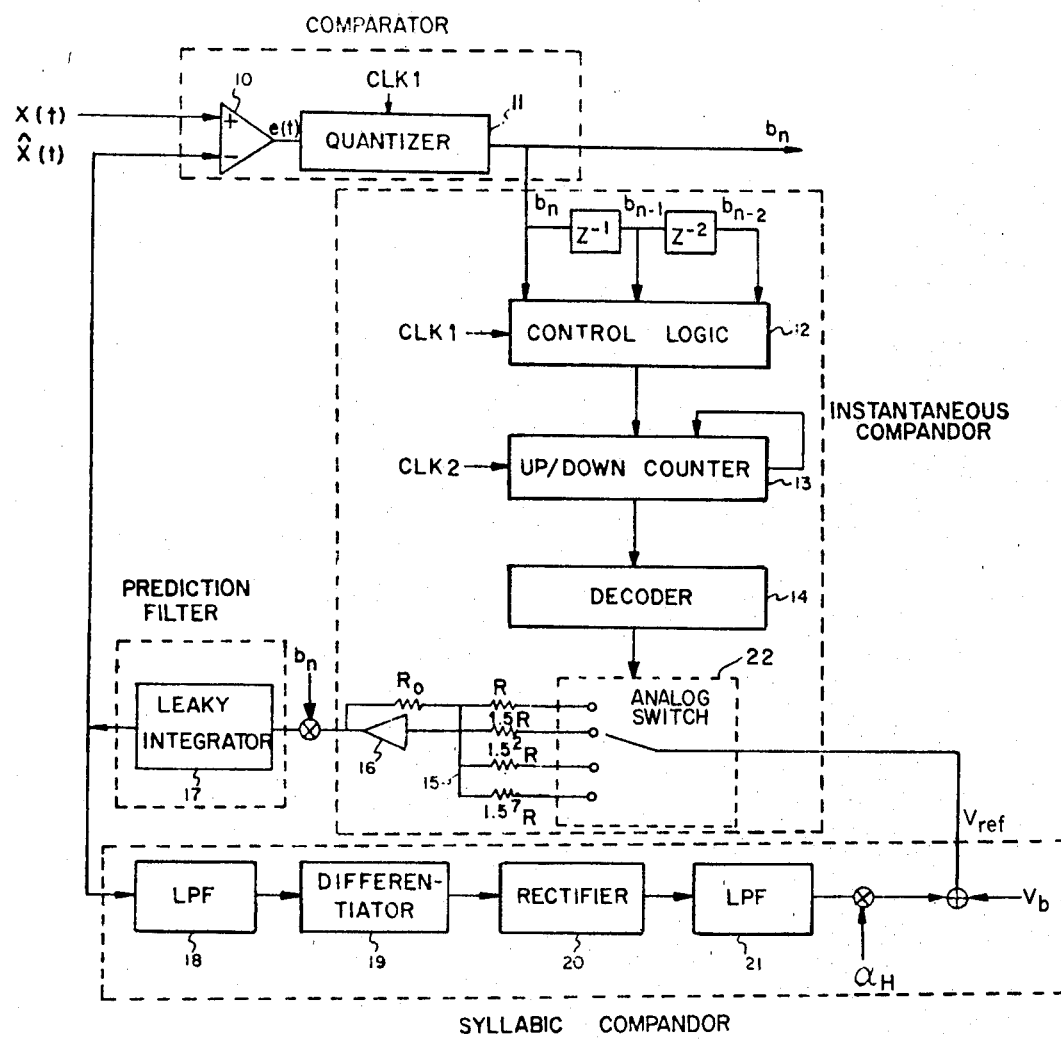
FIG. 1 is a schematic representation of an embodiment of the invention in block form.

FIG. 1 is a block diagram of the hybrid companding delta modulation system embodying the present invention. FIG. 1 only shows the encoder of the system. However, it will be understood that the decoder is simply the feedback portion of the encoder. The decoded signal that is the output of the prediction filter 17 must be filtered by a low pass filter. The same is true for the system input signal X(t).

The encoder of FIG. 1 is divided into four major portions: a comparator, an instantaneous compandor, a syllabic compandor and a prediction filter enclosed individually by dotted boxes.

The comparator includes a differential amplifier 10 onto which the input signal X(t) and the predicted signal $\hat{X}$(t) are impressed. The differential amplifier 10 is followed by a quantizer 11 which is clocked by a clock signal CLK1. Accordingly, a binary signal $b_n$ is generated by the quantizer 11 at a desired transmission or clock rate. This is effected by taking the sign of the differential or prediction error signal at each sampling instant.

For step size companding the coder output binary signal $b_n$ is stored in a 2 bit memory $Z^{-1}$ and $Z^{-2}$. These stored binary signals $b_{n-1}$ and $b_{n-2}$ are compared with the incoming $b_n$. These signals are impressed on the control logic 12 which is also clocked by the clock signal CLK1. The control logic 12 decides whether to increase, decrease or hold the step size. The logic for step size control may be effected in many different ways. One specific control logic is shown in the following Table I.

TABLE I

| $b_n$ | $b_{n-1}$ | $b_{n-2}$ | Counting |
|---|---|---|---|
| 0 | 0 | 0 | Up count |
| 0 | 0 | 1 | Hold |
| 0 | 1 | 0 | Down count |
| 0 | 1 | 1 | Down count |
| 1 | 0 | 0 | Down count |
| 1 | 0 | 1 | Down count |
| 1 | 1 | 0 | Hold |
| 1 | 1 | 1 | Up count |

The control logic 12 is coupled to an up/down counter 13 which is controlled by the logic. The counter 13 in turn is connected to the decoder 14 and hence to an analog switch 22. Depending on the output of the decoder 14, the analog switch selects one of the resistors indicated by R, 1.5 R, $1.5^2$ R, etc. indicated at 15. A voltage $V_{ref}$ is applied to one of the resistors and a scaling factor is introduced by the operational amplifier 16.

Most of the instantaneous companding adaptive delta modulation systems of the prior art have a fixed reference voltage for the step size compandor regardless of variations of the input signal. In accordance with the present invention, however, the reference voltage which controls the basic step size is changed according to variations of the input signal by estimating the slope energy of the input signal X(t) to the codec and using it after scaling and biasing as a reference voltage of the instantaneous compandor.

The input slope variation is estimated continuously based on the decoded signal by the syllabic compandor of FIG. 1. The slope variation may be estimated in a feedforward mode as opposed to a feedback mode shown in FIG. 1 directly from the input signal X(t). In this case, the system would become more complex because a buffer is required to store the input signal. Further, the slope information will have to be transmitted along with the hybrid companding delta modulation binary output signal after coding and multiplexing. Also, as indicated before, the input amplitude variation may be estimated instead of the slope variation for syllabic companding.

The syllabic compandor includes a low pass filter 18 coupled to the prediction filter followed by a differentiator 19, rectifier 20 and another low pass filter 21. In case the input amplitude variation is estimated the differentiator 19 may be omitted. However, since a delta modulation system is basically one that follows the input slope rather than the amplitude, use of the slope information is preferred.

In the syllabic compandor the proper choice of the values of the scaling factor $a_H$ and the bias voltage $V_b$ is very important. Since the syllabic compandor is operated in the feedback mode based on the decoded signal, the predicted signal $\hat{X}$(t) may become unstable if $a_H$ is larger than unity. Also, without the proper bias voltage the decoder may have a dead zone effect.

The prediction filter of FIG. 1 is essentially a leaky integrator 17. Its input is the companded voltage, that is, the output of the instantaneous compandor or the output of the operational amplifier 16, having its polarity controlled by the hybrid companding delta modulation output signal $b_n$ as shown. It is feasible to use a perfect integrator for the prediction filter instead of the leaky integrator shown. However, since a leaky integrator minimizes the effect of channel errors, it is preferred over a perfect integrator.

FIG. 2 to which reference is now made, shows the hardware implementation of the system of the invention as shown at FIG. 1. For comparing the input signal and the predicted signal X(t) and $\hat{X}$(t) a differential amplifier 10 is used. The output is sampled by the clock $\phi_1$. The sampled signal is stored or delayed by three D flip-flops 20 generating respectively output signals $Q_1$, $\overline{Q}_1$; $Q_2$, $\overline{Q}_2$; $Q_3$, $\overline{Q}_3$. The present and two stored previous bits are compared by the control logic shown in the two dotted boxes for up or down counting the whole operation of the counter 40. The control logic for up or down counting or hold is shown in Table I.

The control logic circuitry may be constructed with AND circuits 30, OR circuits 32 34 and gates such as NOR circuit 31 and NAND circuit 33. As shown, the signals $Q_1$, $O_1$, $Q_2$ and $\overline{Q}_2$ are fed into the lower control logic box. It is to be noted that the inputs $Q_A$, $Q_B$, and $Q_C$ of the control logic circuits are the outputs of the counter 40. The up/down counter 40 is clocked by the clock signal $\phi_2$ which is delayed with respect to the clock signal $\phi_1$. For up counting the input terminal labeled "up" should be in logic level "0" and the input terminal or pin labelled "down" should be in logic level "1"; for down counting the opposite should be true. For hold operation both terminals or pins should be in the "1" state.

The output of the up/down counter 40 is fed to a decoder 50 for the instantaneous companding of the step size. This decoder is a conventional 3-to-8 decoder (or demultiplexer) commonly used in digital circuits. The decoder is connected to one of eight resistors (10K, 15K, 22.5K, 33.75K, 50.6K, 75.9K, 113.9K and 170.8K ohms) through an analog switch 51. These resistor values correspond to 10K, 10×1.5K, 10×$1.5^2$K etc. They determine the magnitude fo the step size companding. Of course it will be understood that the number of resistor values may be changed according to the desired companding range. The factor 1.5 is an optimum value in maximizing the signal-to-quantization noise ratio.

The decoder output signal through one of the selected resistors is integrated by a leaky low pass filter called a prediction filter in FIG. 1 which includes a high slew rate operational amplifier 60. When the output of the prediction is low pass filtered by filter 70, it becomes a close replica of the input signal $X(t)$. The low pass filter 70 should have a sharp filter skirt decay. It may be the same filter as used in pulse code modulation.

An important and significant aspect of the present invention is the use of syllabic companding as well as instantaneous companding. The syllabic compandor generates a reference voltage $V_{ref}$ which is impressed on the selected one of eight resistors connected to the analog switch 51 to update the basic step size continuously. For syllabic companding the reference voltage $V_{ref}$ is continuously changed by the syllabic compandor consisting mainly of low pass filters, a differentiator and a rectifier.

The reference voltage $V_{ref}$ is obtained as follows. The output of the prediction filter 60 is low pass filtered by a filter 70 to remove high frequency quantization noise.

The low pass filter may have a bandwidth from 0 to 3,400 Hz. This may be the same filter used for band limiting the input signal or it may have an upper cutoff frequency which is slightly lower. If the clock rate is below 20 KHz, the cutoff frequency can be lowered significantly to as low as 2,500 Hz.

The band limited signal is then differentiated to obtain the signal slope information. The differentiator may include an operational amplifier 71. The amplitude of the differentiator output is scaled up by the operational amplifier 72. It will be noted that if the envelope of the input signal amplitude rather than its slope is desired, the differentiator may be omitted. The signal having its scale changed is then fully rectified. The full wave rectifier may be realized by two operational amplifiers 73 and 74 utilizing two diodes as shown.

The rectified signal representing the slope information of the input signal is averaged by an RC low pass filter. The time constant of the low pass filter may be in the range between 2 and 20 milliseconds. Since the syllabic compandor must have a minimum point, a bias voltage of 5 volts is used with a voltage divider to prevent the output voltage from becoming zero. The output voltage has a polarity depending on the sign bit $\overline{Q}_1$ or $Q_1$ of the flip-flop $20_1$. It is the reference voltage $V_{ref}$ applied to the input of the operational amplifier 71 through one of the eight resistors. The sign of the reference voltage is changed by opening or closing an analog switch 81 upon which the signal $Q_1$ or $\overline{Q}_1$ of the flip-flop $20_1$ is impressed. The analog switch 81 incorporates another operational amplifier 80. Hence, when the switch 81 is open then the reference voltage is the same as the output of the low pass filter to the left of amplifier 74. If the switch 81 is closed the reference signal has the same magnitude but the opposite polarity.

FIG. 3 illustrates, by way of example, a circuit for generating the two clock signals $\phi_1$ and $\phi_2$. The circuit utilizes a crystal oscillator. It will be evident that the output signals of the three flip-flops 20 are delayed by the logic control circuit. Hence, the clock signal controlling the up/down counter 40 must also be delayed as shown in FIG. 3. The clock delay should be minimized.

The delay time between the two clocks $\phi_1$ and $\phi_2$ may be made a minimum by adjusting the RC time constant of the circuit of FIG. 3.

There has thus been disclosed a hybrid companding delta modulation system utilizing both a syllabic compandor and an instantaneous compandor. The instantaneous compandor adjusts the quantizer step size instantaneously in accordance with a control logic means based on the present and two prior bits in response to variations of the input signal. The syllabic compandor adjusts the long term step size of the quantizer. It estimates the envelope slope variations of the input signal and impresses the thus obtained reference voltage upon the voltage means which generates the step size.

What is claimed is:

1. A hybrid companding delta modulation system comprising:
   a. a comparator for comparing a system input signal and a predicted signal and for generating digital output signals sampled in accordance with a clock signal;
   b. an instantaneous compandor coupled to said comparator and including a plurality of flip-flops for storing a present output signal and two previous signals, a control logic means coupled to said flip-flops for comparing the present output and two previous signals, an up or down counter coupled to and controlled by said logic means in accordance with a predetermined control logic to produce up or down logic levels, and a decoder coupled to said counter;
   c. voltage means forming part of said instantaneous compandor for generating voltage steps and controlled by said decoder;
   d. a syllabic compandor including means for measuring a characteristic of the system input signal and for generating a reference voltage, thereby to control the voltage step size of said voltage means; and
   e. a prediction filter coupled between said voltage means and said comparator for supplying the predicted signal varying both in accordance with the slope variations of the system input signal and said control logic means output in accordance with variations of the system input signal.

2. A system as defined in claim 1 wherein said system input signal is an analog speech signal.

3. A system as defined in claim 1 wherein said means for measuring a characteristic of the system input signal measures the amplitude of the system input signal.

4. A system as defined in claim 2 wherein said means for measuring the characteristic of the system input signal measures the slope of the envelope of the speech signal.

5. A system as defined in claim 1 wherein said comparator includes a differential amplifier followed by a quantizer.

6. A system as defined in claim 1 wherein said voltage means includes a plurality of resistors and an analog switch for connecting a selected one of said resistors between said decoder and said prediction filter in accordance with the said control logic.

7. A system as defined in claim1 wherein said means for measuring includes a first low pass filter coupled to said prediction filter for receiving the predicted signal, a rectifier and a further low pass filter connected in series.

8. A system as defined in claim 7 wherein said means for measuring further includes a differentiator coupled between said first low pass filter and said rectifier for obtaining slope variations of the envelope of the system input signal.

9. A system as defined in claim 1 wherein means is provided for generating an additional delayed clock signal and for impressing it upon said up or down counter and for impressing said first referred to clock signal on said control logic.

10. The method of coding an analog input signal to the system by hybrid companding delta modulation, said method comprising the steps of:
   a. comparing the system input signal with a predicted signal and generating a series of digital signals sampled in accordance with a clock signal;
   b. instantaneously companding the digital signals by storing a predetermined number of successive digital signals, generating an up count, down count or hold in accordance with a predetermined logic controlled by the stored digital signals, decoding the counts and controlling the magnitude of voltage steps in accordance with the decoding;
   c. estimating a characteristic of the input signal to obtain syllabic companding to generate a slowly varying reference voltage to control additionally the voltage steps; and
   d. integrating the voltage steps to obtain the predicted signal.

11. The method defined in claim 10 wherein the characteristic of the system input signal is estimated by obtaining the slope energy of the input signal.

12. The method defined in claim 10 wherein the characteristic of the system input signal is estimated by obtaining the envelope of the input signal amplitude.

13. The method defined in claim 10 wherein the system input signal is an analog speech signal to be compared with a predicted analog signal.

14. The method defined in claim 10 including the further step of clocking the control logic in accordance with said clock signal.

15. The method defined in claim 14 which includes the further step of clocking the up count, down count or hold in accordance with an additional clock signal delayed with respect to the first-recited clock signal.

16. A system as defined in claim 2 wherein said means for measuring a characteristic of the system input signal is connected in a feedforward manner for measuring the slope of the envelope of the analog speed signal.

17. A system as defined in claim 1 wherein said means for measuring a characteristic of the system input signal is connected in a feedforward manner for measuring the amplitude of the system input signal.

* * * * *